(12) United States Patent
Peng et al.

(10) Patent No.: US 12,408,334 B2
(45) Date of Patent: Sep. 2, 2025

(54) METHOD FOR MANUFACTURING FULLY SELF-ALIGNED HIGH-DENSITY 3D MULTI-LAYER MEMORY

(71) Applicant: CHENGDU PBM TECHNOLOGY LTD., Chengdu (CN)

(72) Inventors: Jack Zezhong Peng, Chengdu (CN); Ke Wang, Chengdu (CN)

(73) Assignee: CHENGDU PBM TECHNOLOGY LTD., Chengdu (CN)

( * ) Notice: Subject to any disclaimer, the term of this patent is extended or adjusted under 35 U.S.C. 154(b) by 476 days.

(21) Appl. No.: 17/799,880

(22) PCT Filed: Sep. 30, 2021

(86) PCT No.: PCT/CN2021/122090
§ 371 (c)(1),
(2) Date: Aug. 15, 2022

(87) PCT Pub. No.: WO2022/174593
PCT Pub. Date: Aug. 25, 2022

(65) Prior Publication Data
US 2023/0345714 A1    Oct. 26, 2023

(30) Foreign Application Priority Data
Feb. 19, 2021   (CN) .......................... 202110189418.1

(51) Int. Cl.
*H01L 21/31* (2006.01)
*H01L 21/311* (2006.01)
(Continued)

(52) U.S. Cl.
CPC ............ *H10B 20/40* (2023.02); *H01L 21/311* (2013.01); *H10D 8/051* (2025.01)

(58) Field of Classification Search
CPC ...... H10B 20/40; H10B 63/845; H10B 99/16; H10B 20/00; H01L 21/311; H10D 8/051; Y02D 10/00
See application file for complete search history.

(56) References Cited

U.S. PATENT DOCUMENTS

| | | | |
|---|---|---|---|
| 7,541,252 B2 * | 6/2009 | Eun | ........................ H10B 63/20<br>257/E21.364 |
| 11,647,636 B2 * | 5/2023 | Lin | ........................ H10D 62/80<br>257/295 |

(Continued)

FOREIGN PATENT DOCUMENTS

| | | |
|---|---|---|
| CN | 101615656 A | 12/2009 |
| CN | 101447502 B | 1/2013 |

(Continued)

OTHER PUBLICATIONS

International Search Report, PCT/CN2021/122090, Dec. 30, 2021, 4 pages.

*Primary Examiner* — S M Sohel Imtiaz

(57) ABSTRACT

The present disclosure provides a method for manufacturing a fully self-aligned high-density 3D multi-layer memory, which relates to the technical field of memory manufacturing. The method includes the following steps: 1) forming a base structure; 2) grooving the base structure; 3) filling an insulating medium in the division groove; 4) deep-hole etching the insulating medium in step 3 to form memory cell holes discretely arranged along the division groove, where the insulating medium is present between adjacent memory cell holes, and conductive medium layers and insulating medium layers of the base structure are exposed in the memory cell holes; and 5) disposing various layers of medium required by a preset memory structure layer by layer onto the inner walls of the memory cell holes. The (Continued)

semiconductor memory manufactured according to the present disclosure has high storage density.

9 Claims, 10 Drawing Sheets

(51) Int. Cl.
  *H10B 20/00* (2023.01)
  *H10D 8/01* (2025.01)

(56) References Cited

U.S. PATENT DOCUMENTS

| | | | |
|---|---|---|---|
| 2013/0270626 A1* | 10/2013 | Lue | H10D 30/69 257/324 |
| 2013/0308363 A1* | 11/2013 | Scheuerlein | G11C 7/18 365/63 |
| 2019/0067322 A1* | 2/2019 | Chen | H01L 21/0273 |
| 2021/0013303 A1* | 1/2021 | Chen | H10B 41/50 |
| 2022/0344476 A1* | 10/2022 | Chan | H10D 30/015 |

FOREIGN PATENT DOCUMENTS

| | | | | |
|---|---|---|---|---|
| CN | 109545787 A | | 3/2019 | |
| CN | 109686703 A | * | 4/2019 | ......... H01L 27/1052 |
| CN | 109887923 A | | 6/2019 | |
| CN | 112992906 A | | 6/2021 | |

* cited by examiner

METHOD FOR MANUFACTURING FULLY SELF-ALIGNED HIGH-DENSITY 3D MULTI-LAYER MEMORY

CROSS REFERENCE TO RELATED APPLICATION(S)

This patent application is a U.S. National Stage Application under 35 U.S.C. 371 of PCT Application No. PCT/CN2021/122090, filed Sep. 30, 2021, which claims the benefit and priority of Chinese Patent Application No. 202110189418.1 filed Feb. 19, 2021, the disclosure of which is incorporated by reference herein in its entirety.

TECHNICAL FIELD

The present disclosure relates to memory manufacturing technologies.

BACKGROUND ART

The conventional technologies include various digital storage technologies such as an erasable programmable read only memory (EPROM), an electrically erasable programmable read only memory (EEPROM), a flash memory, a NAND-flash memory, a hard disk, a compact disk (CD), a digital versatile disk (DVD), and a Blu-ray disc registered by the Blu-ray Disc Association, which have been widely used for data storage for more than 50 years. However, the service life of storage media is usually less than 5 to 10 years. The current anti-fuse storage technology developed for big data storage cannot meet the requirement of mass data storage because of high costs and low storage density.

Chinese patent application No. CN101447502A discloses a non-volatile memory device and manufacturing and using methods thereof, and referring to FIG. 11 to FIG. 14, key process steps thereof comprise: disposing a data storage layer 130 on an inner wall of a groove 125, further filling a second electrode layer 140, and then patterning the second electrode layer 140. The above patent application has the following shortcomings:

1. During patterning of the second electrode layer 140, since a particular opening area of a patterned etching region is required for deep hole etching to ensure that the conductive medium at the bottom of the deep hole is completely etched to prevent a short circuit, it requires that a width of the patterned etching region cannot be excessively small. But at the same time, to ensure the minimal conductivity of a vertical bit line, a cross-section area of the bit line formed by the remaining conductive medium should have a relatively large width. Minimum area per memory cell on a single layer depends on minimum widths of both the patterned etching region and the remaining conductive bit line region. As a result, memory bit density is limited by the process level.

2. Position (a) in FIG. 1 shows an ideal state. However, if misalignment in a patterning process occurs and conductive materials of adjacent bit lines somewhere on a side wall are not isolated, it is prone to result in a short circuit. Position (e) in FIG. 1 of the present disclosure shows this possibility.

3. During patterning, quality of a programmable medium at the edge of the bit line may be damaged, resulting in electric leakage and inconsistency of breakdown voltages. Position (d) in FIG. 1 of the present disclosure shows this possibility.

Chinese patent application No. CN101615656A discloses a non-volatile memory device and a manufacturing method thereof. Referring to FIG. 11, a thickness of a storage medium (150) or a buffer layer (162), as a key parameter affecting device performance, depends on the control of a deep hole etching technology. Besides, it cannot be ensured that thicknesses of storage mediums (150) or buffer layers (162) of memory cells at various layers are the same. There are also the aforementioned problem 3.

SUMMARY

To solve the foregoing technical problem, the present disclosure provides a method for manufacturing a fully self-aligned high-density three-dimensional (3D) multi-layer memory, which is characterized by high bit density, low costs, and a high yield.

To solve the foregoing technical problem, the present disclosure adopts the technical solution of a method for manufacturing a fully self-aligned high-density 3D multi-layer memory, including:

step 1: forming a base structure, where the predetermined number of conductive medium layers and the predetermined number of insulating medium layers are disposed in such a manner that the conductive medium layers and the insulating medium layers are alternately stacked on each other, to form the base structure; and step 2: grooving the base structure, where the base structure is grooved to form a curved division groove penetrating from a top layer to a bottom layer in the base structure, so that the division groove divides the base structure into two interdigitated structures that are staggered and separated from each other.

The method further includes:

step 3: filling an insulating medium in the division groove;

step 4: deep-hole etching the insulating medium in step 3 to form memory cell holes discretely arranged along the division groove, where the insulating medium is present between adjacent memory cell holes, a thickness of the insulating material may depend on a minimum etching process size, and the conductive medium layers and the insulating medium layers of the base structure are exposed at the inner walls of the memory cell holes; and step 5: disposing various layers of medium required by a preset memory structure layer by layer onto the inner walls of the memory cell holes.

Further, in step 5, the preset memory structure may be one of the following structures:

A PN junction semiconductor memory structure, a Schottky semiconductor memory structure, a resistance change memory structure, a magnetic phase change memory structure, a phase change memory structure, and a ferroelectric memory structure.

In step 4, the memory cell holes may be through holes penetrating through the base structure.

The preset memory structure may be a PN junction semiconductor memory structure, including a P-type conductive region, an N-type conductive region, and an insulating medium region disposed therebetween.

Alternatively, the preset memory structure may be a Schottky diode memory structure, including a semiconductor conductive region, a metal conductive region, and an insulating medium region disposed therebetween, where a material of the semiconductor conductive region is a semiconductor required for forming the Schottky diode structure, and a material of the metal conductive region is metal required for forming the Schottky diode structure.

Step 3 includes:
step 3.1: disposing the insulating layer in the division groove.
Further, step 5 includes:
step 5.1: depositing an intermediate medium layer on the inner wall of each memory cell hole, where the intermediate medium layer includes a first medium layer made of an insulating medium;
step 5.2: etching the intermediate medium layer in a bottom area of the memory cell hole, to form a through hole penetrating through the intermediate medium layer; and
step 5.3: disposing a core medium in the memory cell hole.

The present disclosure has the beneficial effects of low process costs, a high yield, and high storage density of the manufactured semiconductor memory. The multi-layer 2-bit OTP memory cell of the present disclosure is formed by medium isolation of the deep cell holes in the deep semiconductor groove, which requires only two deep well etching and filling processes, and cell isolation and the left and right interdigitated structures are completed in single one step. Since a minimum size of a memory cell array is only limited by the deep hole etching process and a minimum size of the isolation medium only needs to be thin enough to be functioning well as insulator, the present disclosure can achieve higher density. The programmable medium of the present disclosure is not damaged by the etching process, and desirable consistency of thickness and quality of the programmable medium in different memory cells is ensured. In particular, process parameters of the present disclosure are easier to control.

DETAILED DESCRIPTION OF THE EMBODIMENTS

The manufacturing method of the present disclosure includes steps 1-6.

Figure 1:
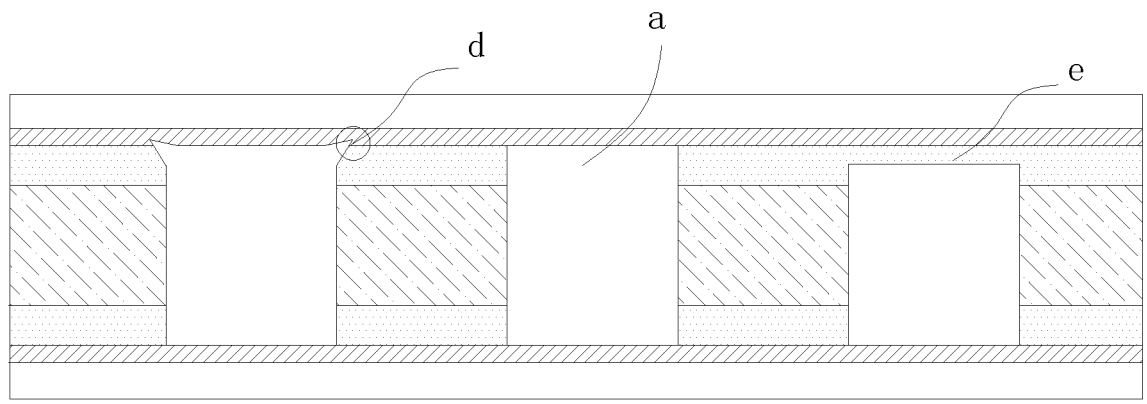
FIG. 1 is a schematic diagram of the prior art.
Figure 2:
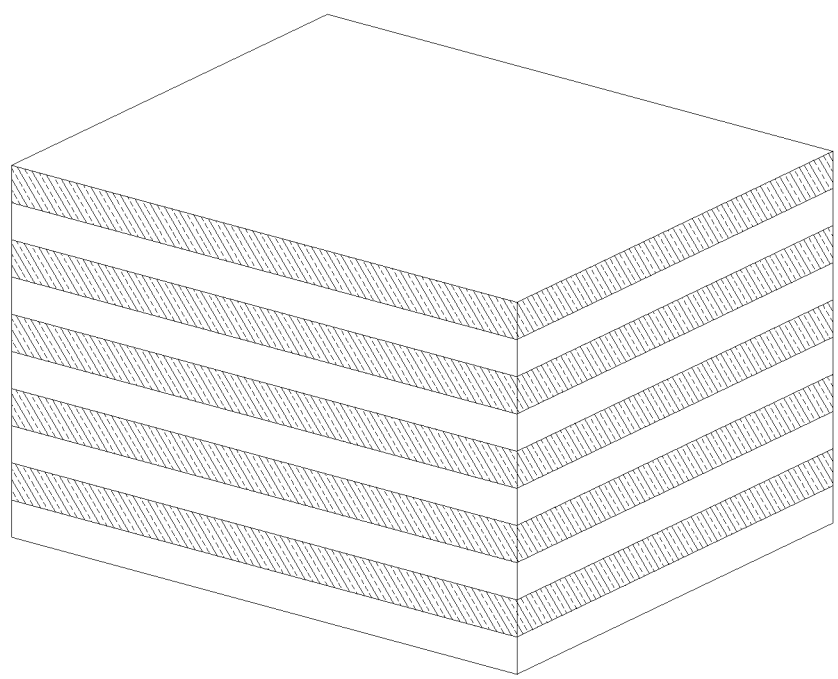
FIG. 2 is a schematic perspective view of a base structure.
Figure 3:
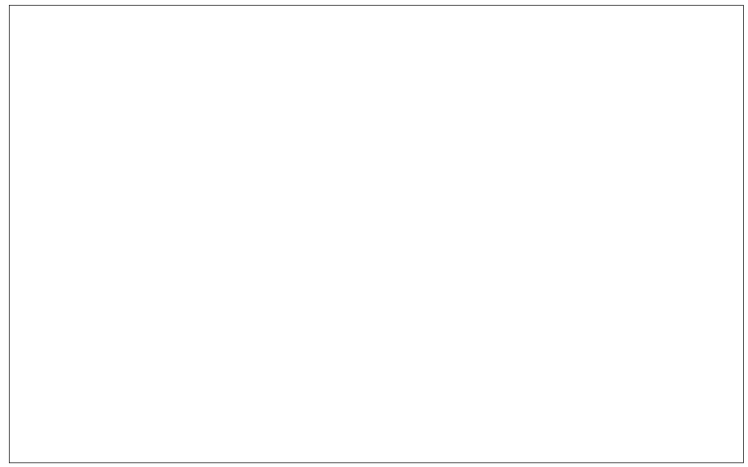
FIG. 3 is a schematic top view of a prototype structure of the present disclosure.
Figure 4:
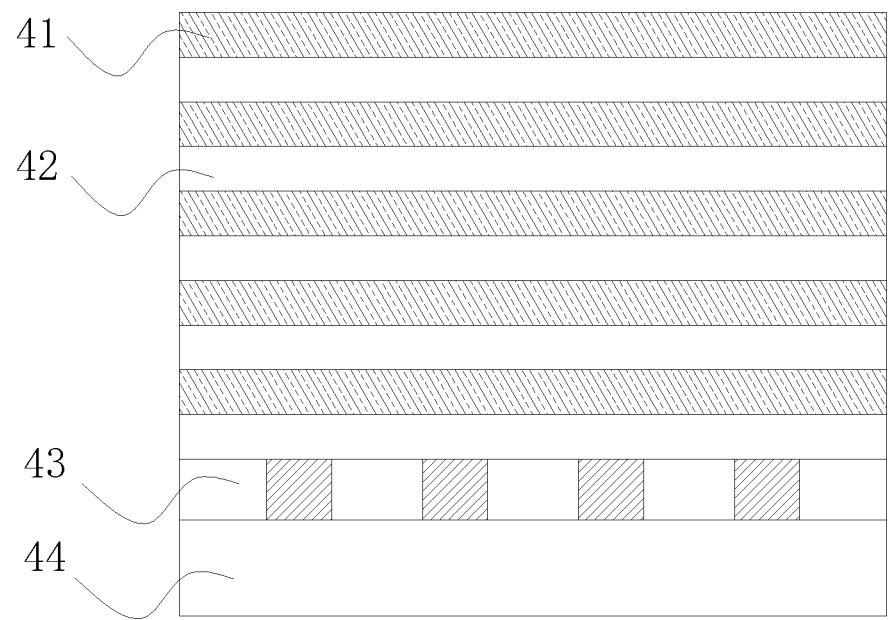
FIG. 4 is a schematic front view of a prototype structure of the present disclosure.

Step 1: a base structure is formed. The predetermined number of conductive medium layers and the predetermined number of insulating medium layers are disposed in such a manner that the conductive medium layers and the insulating medium layers are alternately stacked on each other, to form the base structure, as shown in FIG. 2 to FIG. 4. In an actual process, the base structure is disposed on a substrate and an underlying circuit, as shown in FIG. 4. In FIG. 4, 42 is an insulating medium layer, 41 is a conductive medium layer, 43 is the underlying circuit, and 44 is the substrate.

Figure 5:
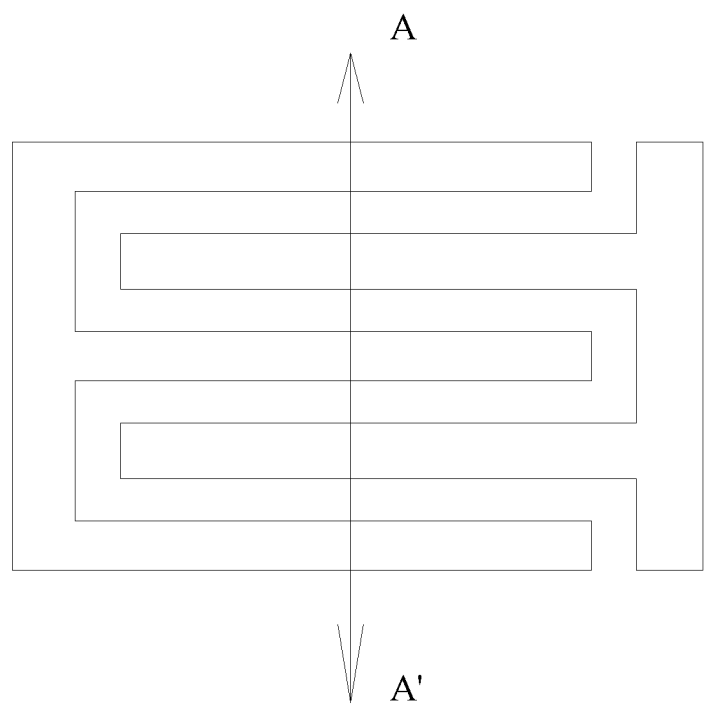
FIG. 5 is a schematic top view of a prototype structure obtained after step 2 of the present disclosure.
Figure 6:
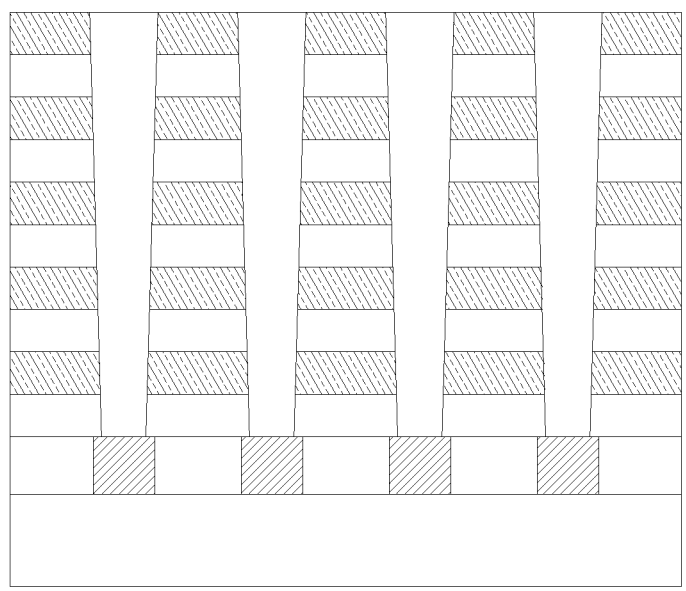
FIG. 6 is a schematic cross-sectional view of a prototype structure obtained after step 2 along an A-A' direction.

Step 2: the base structure is grooved. The base structure is grooved to form a curved division groove penetrating from a top layer to a bottom layer on the base structure, so that the division groove divides the base structure into two interdigitated structures that are staggered and separated from each other, as shown in FIG. 5 and FIG. 6. FIG. 6 is a schematic cross-sectional view of FIG. 5 along an A-A' direction.

Figure 7:
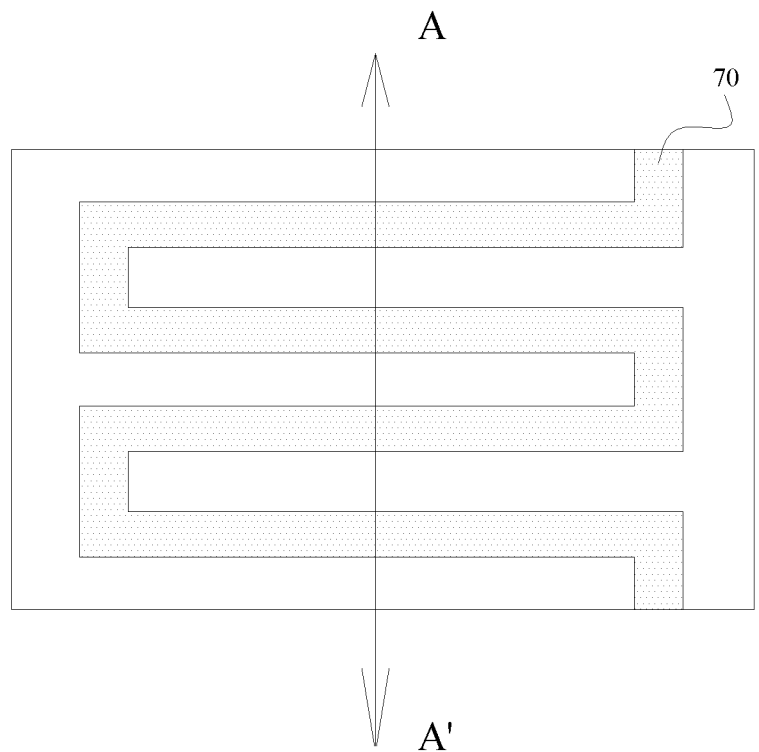
FIG. 7 is a schematic top view of a prototype structure obtained after step 3 of the present disclosure.
Figure 8:
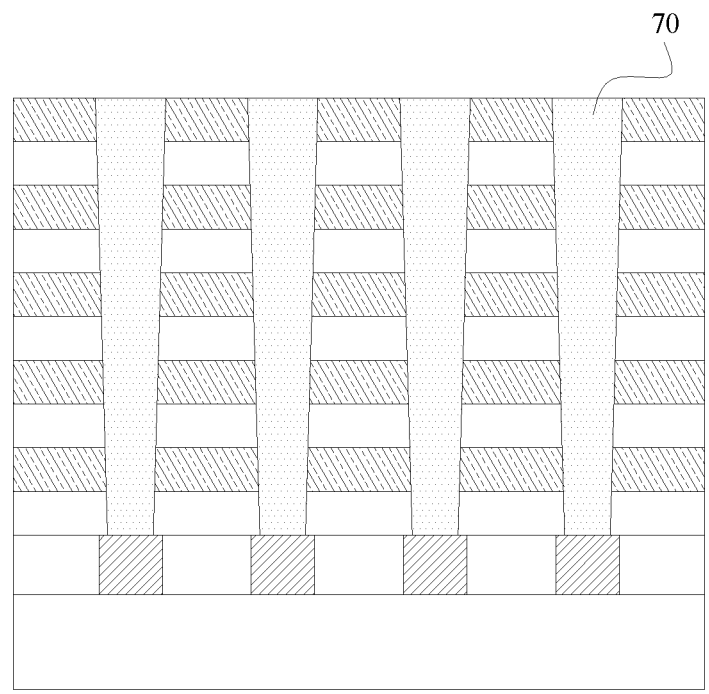
FIG. 8 is a schematic cross-sectional view of a prototype structure obtained after step 3 along an A-A' direction.
Figure 9:
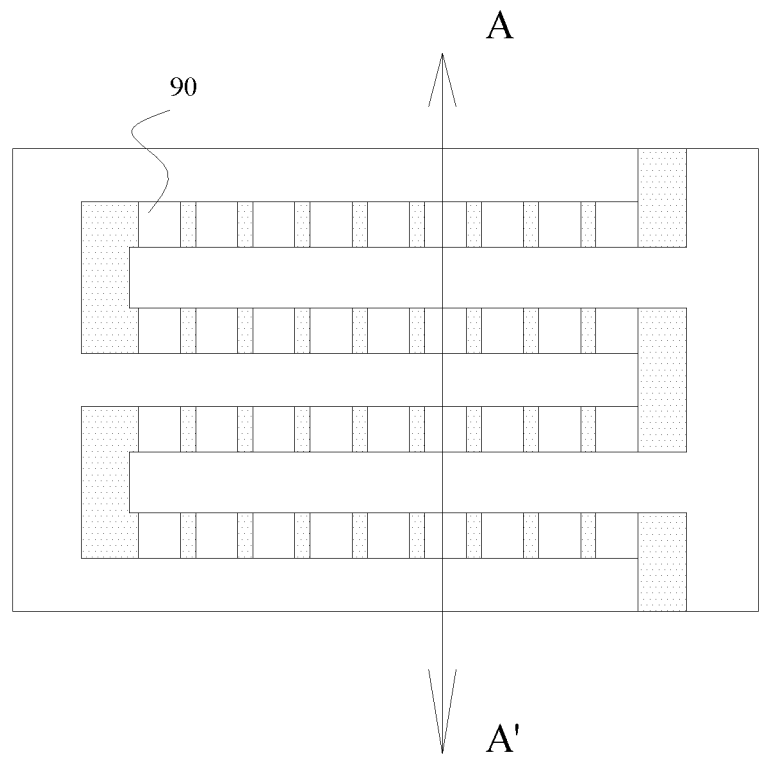
FIG. 9 is a schematic top view of a prototype structure obtained after step 4.
Figure 10:
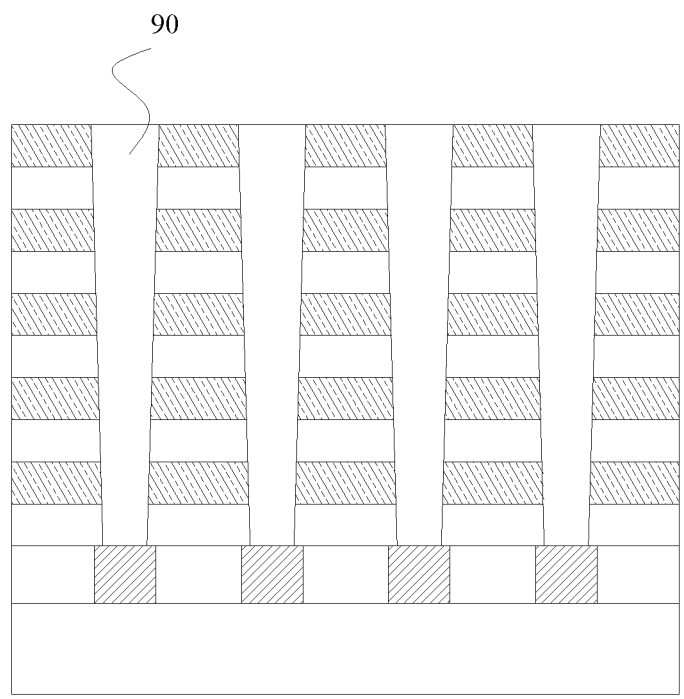
FIG. 10 is a schematic cross-sectional view of a prototype structure obtained after step 4 along an A-A' direction.

Step 3: an insulating medium 70 is filled in the division groove, as shown in FIG. 7 and FIG. 8, which of the present disclosure is significantly different from the prior art.

Figure 12:
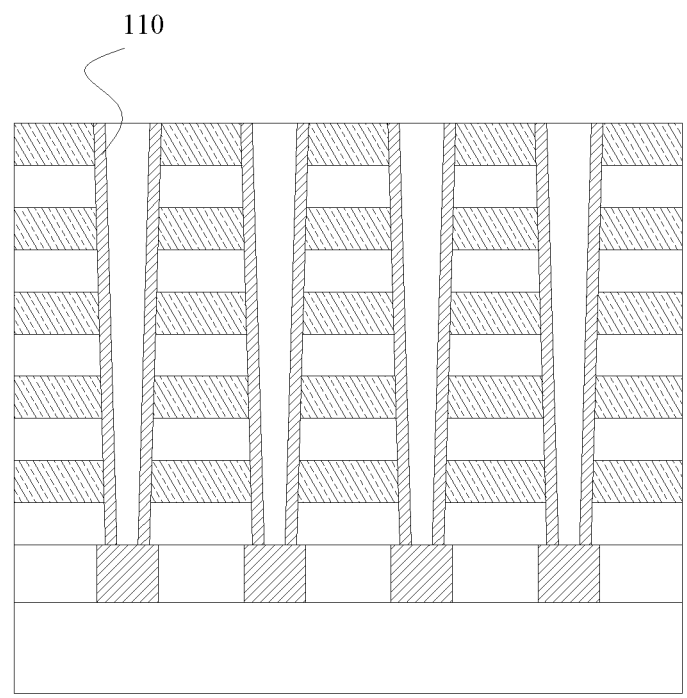
FIG. 12 is a schematic cross-sectional view of a prototype structure obtained after step 5 along an A-A' direction.
Figure 13:
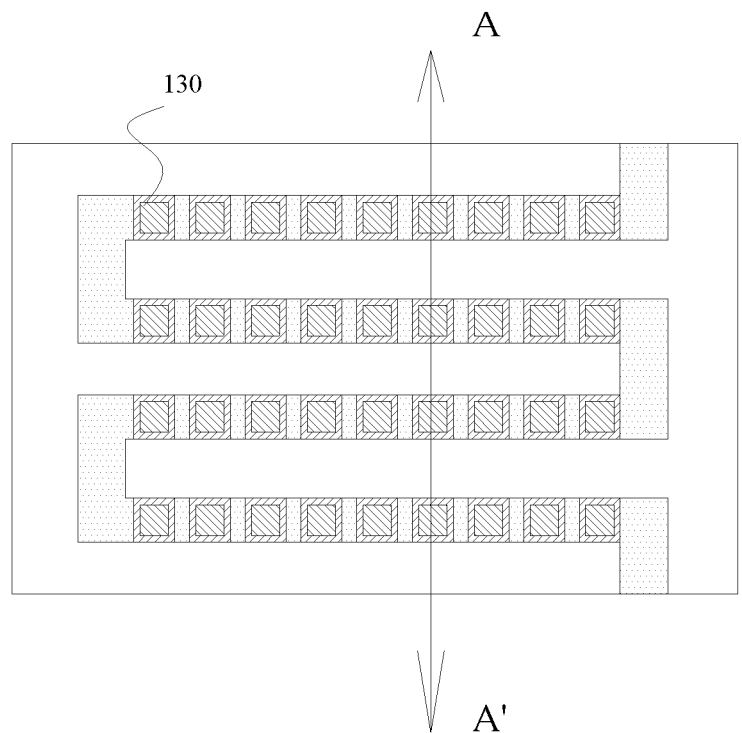
FIG. 13 is a schematic top view of a prototype structure obtained after step 6.
Figure 14:
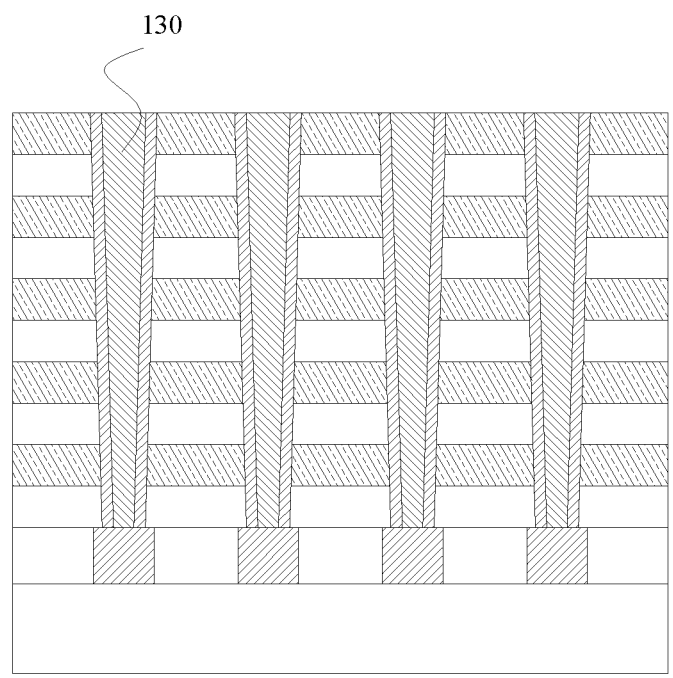
FIG. 14 is a schematic cross-sectional view of a prototype structure obtained after step 6 along an A-A' direction.
Figure 15:
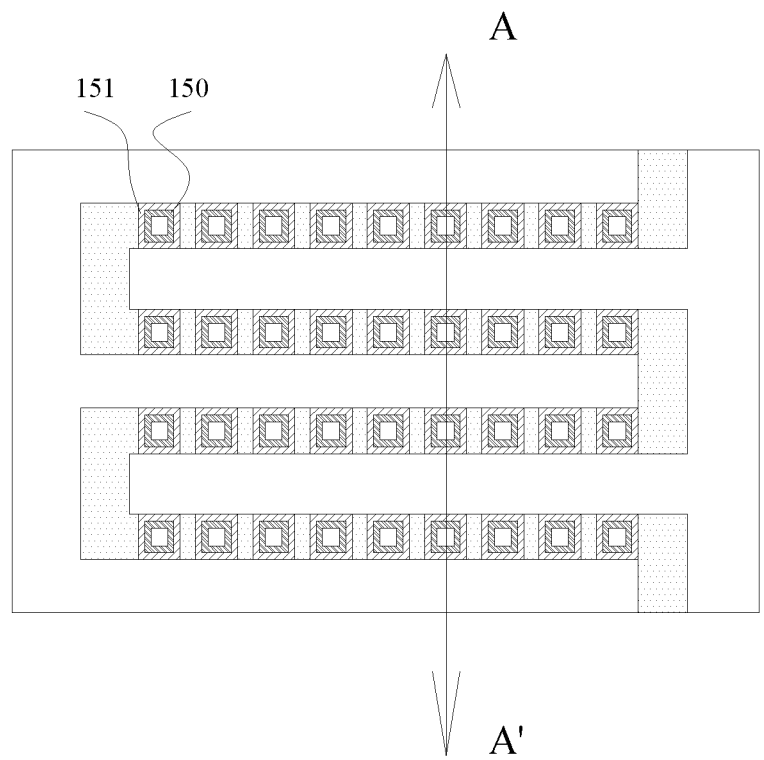
FIG. 15 is a schematic top view of a second implementation.
Figure 16:
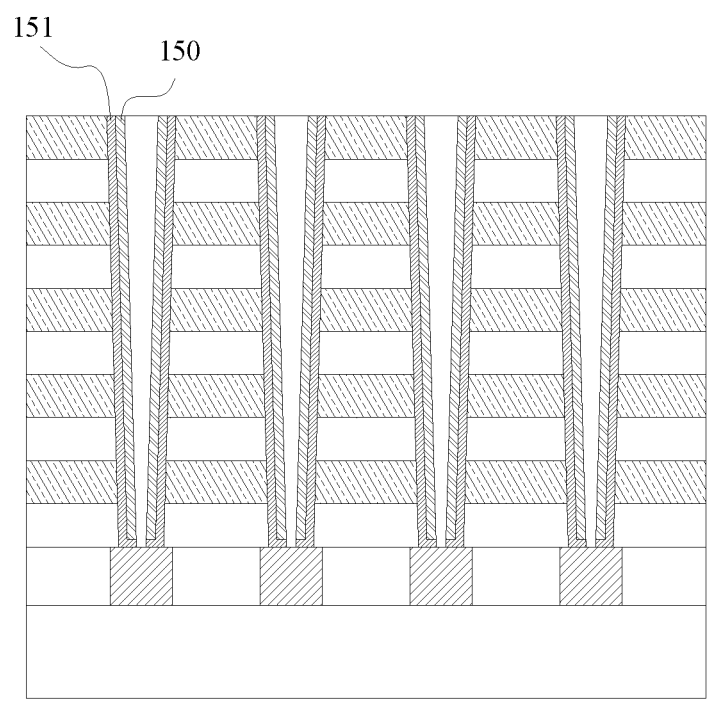
FIG. 16 is a schematic cross-sectional view of a second implementation along an A-A' direction.
Figure 17:
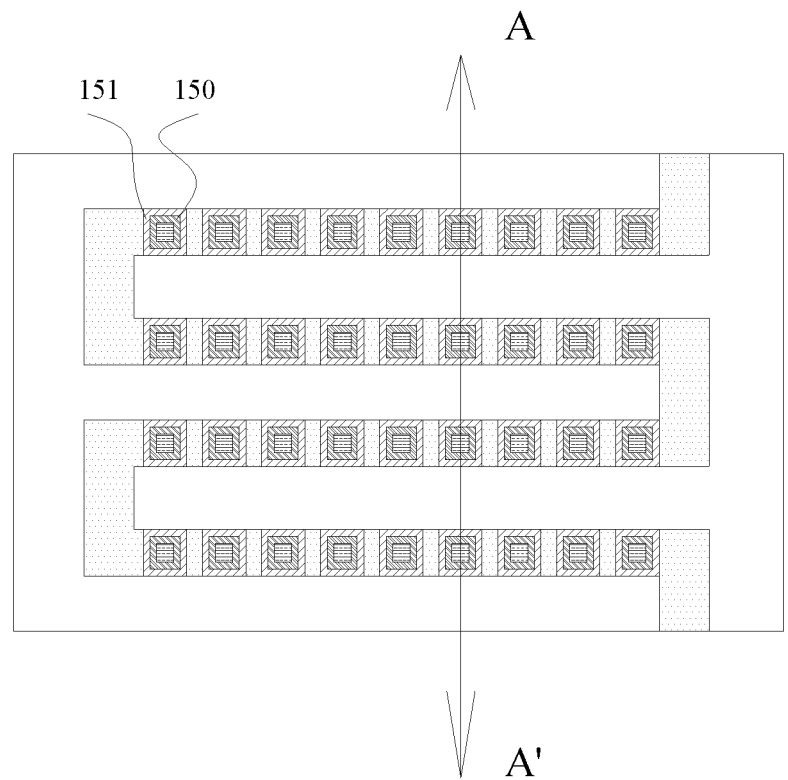
FIG. 17 is a schematic top view of a prototype structure filled with a core medium of a second implementation.
Figure 18:
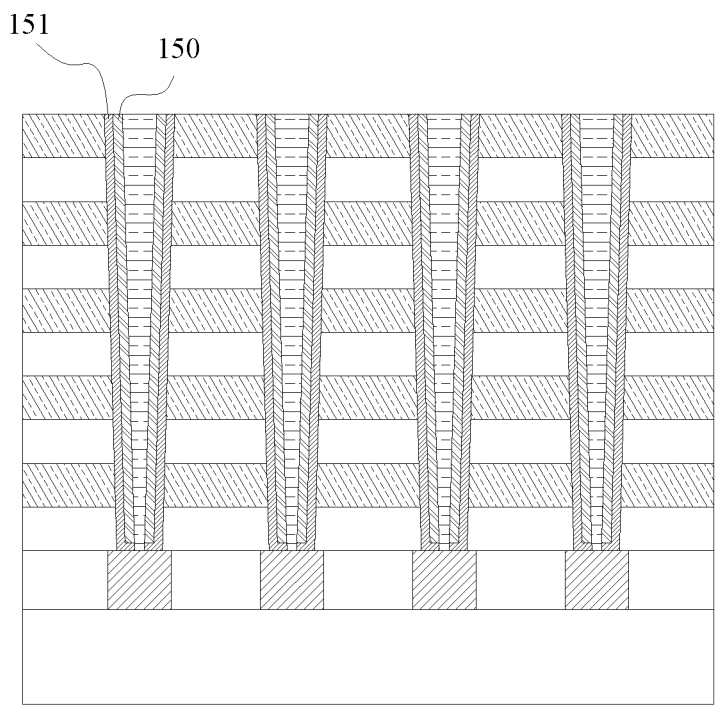
FIG. 18 is a schematic cross-sectional view of a prototype structure filled with a core medium of a second implementation along an A-A' direction.

Step 4: through a mask etching process, memory cell holes are etched along the division groove filled with the insulating medium, as shown in FIG. 12, leaving the conductive medium layers and insulating medium layers of the base structure exposed at the inner wall of the memory cell holes. In the present disclosure, the insulating medium between two adjacent memory cell holes may have a small thickness. In other words, a distance between two adjacent memory cell holes can be as short as possible based on the existing mature etching technology (for example, 10 nm and below) and is not less than a breakdown thickness of the insulating medium (for example, a breakdown thickness of a silicon dioxide layer is 0.5 nm to 5 nm).

Figure 11:
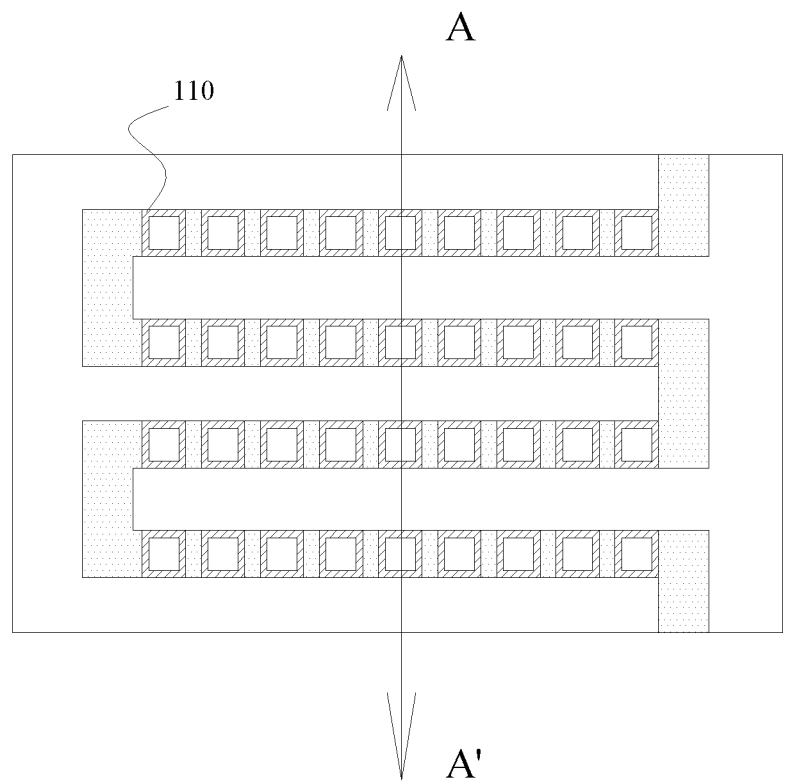
FIG. 11 is a schematic top view of a prototype structure obtained after step 5.

Step 5: an intermediate medium layer is disposed on an inner wall of each memory cell hole 90, as shown in FIG. 11 and FIG. 12. Among various medium layers required for forming a memory, any medium disposed between core medium and conductive medium that is stacked in the base structure is called intermediate medium. For example, in FIG. 19, a first medium is the intermediate medium, and in FIG. 20, an insulating medium and a second medium are the intermediate media.

In step 5, a deposition process can be used. After deposition, bottom isolation is formed in a bottom area of the division groove, and the core medium disposed in each memory cell hole in a subsequent step are isolated from the underlying circuit. Therefore, a "penetration" step is required to facilitate formation of conductive connection between the core medium in the division groove in the subsequent step and the underlying circuit.

A two-layer structure listed in the following first implementation is used as an example. In first penetration method, after step 5 and before step 6, a penetration step may include etching the intermediate medium layer in the bottom region, to form a through hole until the underlying circuit is exposed, so that the core medium filled in step 6 can be in direct contact with the underlying circuit. This method is called etching penetration. Alternatively, after step 6, electric field is applied between the core medium in each memory cell hole and the underlying circuit, to break down an intermediate medium at the bottom region, to form conductive connection, that is, a second penetration method, which is called dielectric breakdown penetration.

Step 6: according to the preset memory structure, the core medium layer is disposed in each memory cell hole formed by etching in step 5, as shown in FIG. 13, FIG. 14, and FIG. 15 to FIG. 18.

The preset memory structure can be one of the following structures:
  a PN junction semiconductor memory structure, a Schottky semiconductor memory structure, a resistance change memory structure, a magnetic phase change memory structure, a phase change memory structure, and a ferroelectric memory structure.

A typical PN junction semiconductor memory structure includes a P-type conductive region, an N-type conductive region, and an insulating medium region disposed therebetween. In the present disclosure, various medium layers required for the memory structure are disposed layer by layer in each memory cell hole in an order of "P-type conductive region—insulating medium region—N-type conductive region". When the conductive medium layer itself of the base structure is made of a P-type conductive material, there is no need to dispose the P-type semiconductor again, the core medium thereof is an N-type semiconductor, the first medium is an insulating medium, and the conductive medium is the conductive medium layer of the base structure.

Various medium layers disposed in each memory cell hole may be a part of medium layers forming the memory, or may certainly be all medium layers forming the memory, which depends on a type of material of the conductive medium layer in the base structure and that of material of the core medium layer. For example, if the material of the conductive medium layer and the material of the core medium layer are both conductors, all structural layers of the memory are deposited layer by layer on the inner wall of the groove, and the conductive medium layer and the core medium layer can be used as bit-line or word-line wiring.

Figure 19:
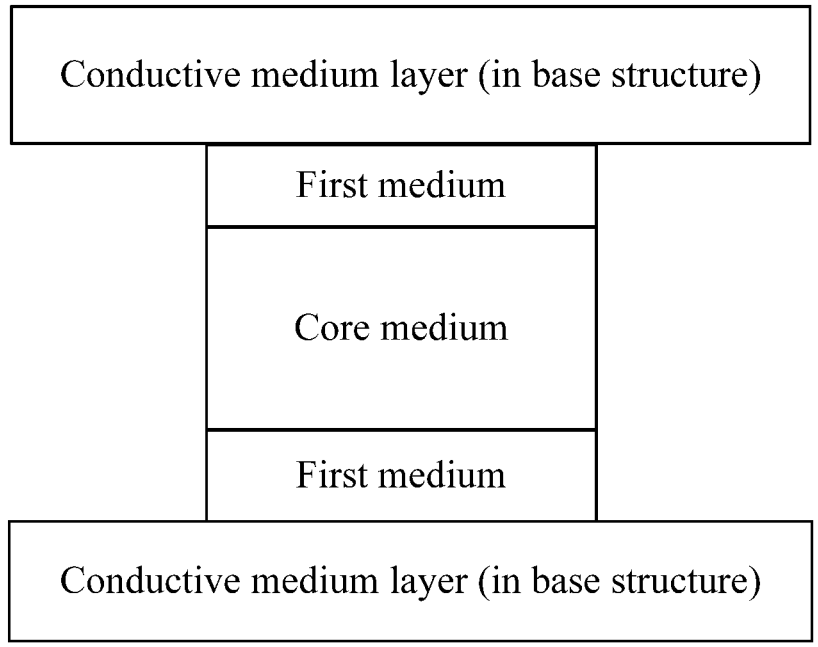
FIG. 19 is a schematic diagram of a first storage structure.
Figure 20:
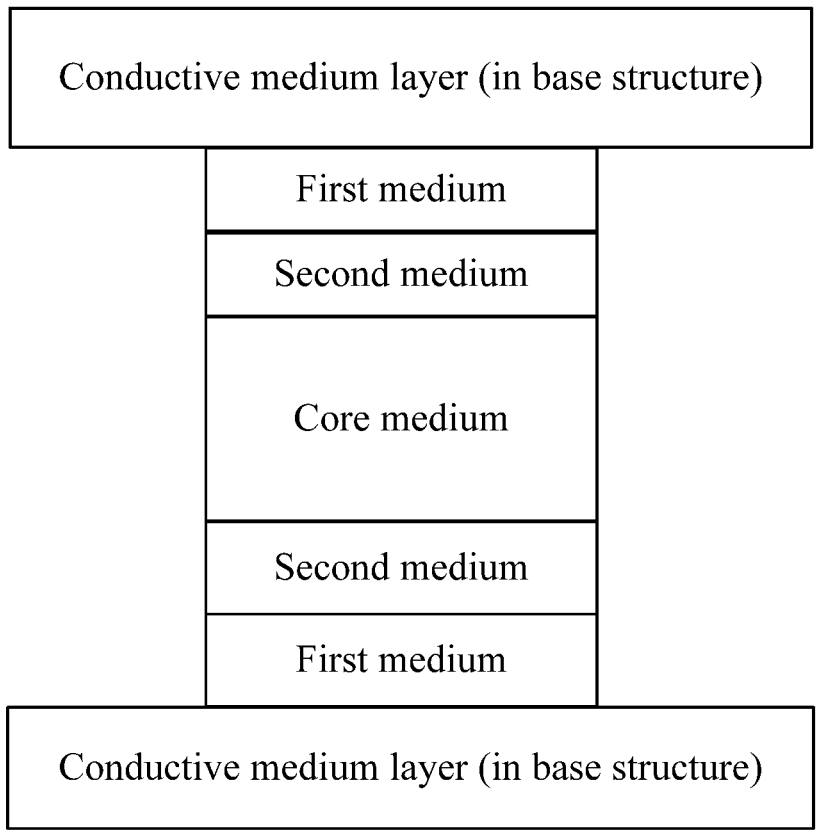
FIG. 20 is a schematic diagram of a second storage structure.

FIG. 19 and FIG. 20 together show two types of memory cells. In the present disclosure, the intermediate medium layer is deposited without a mask in the memory cell hole, which can ensure that thicknesses of intermediate medium layers of any two memory cells are the same, and self-alignment is achieved. In particular, in the aforementioned first penetration method, that is, etching penetration, since the thickness of the intermediate medium layer is very small, self-alignment etching of the intermediate medium layer at the bottom is achieved without a mask.

The first implementation: there are two layers of mediums in the memory cell hole.

In this implementation, only two layers of mediums are disposed in the memory cell hole, that is, a first medium and a core medium, as shown in FIG. 1 to FIG. 14.

Various mediums involved can be combined in the following table. Each combination is an embodiment. Refer to FIG. 19.

| | Base structure Conductive medium layer | Intermediate medium layer (First medium layer) | Core medium layer |
|---|---|---|---|
| Embodiment 1 | P-type semiconductor | Insulating medium | N-type semiconductor |
| Embodiment 2 | N-type semiconductor | Insulating medium | P-type semiconductor |
| Embodiment 3 | Schottky metal | Insulating medium | Semiconductor |
| Embodiment 4 | Semiconductor | Insulating medium | Schottky metal |
| Embodiment 5 | Conductor | Memory medium | Conductor |

The memory medium is a resistance change memory, a magnetic phase change memory, a phase change memory, or a ferroelectric memory.

In the above table, the core medium layer is 130, and the first medium layer 110 is used as an intermediate medium layer. In this implementation, the memory medium may be used as the first medium layer, as in embodiment 5. The memory medium is a medium material that achieves a storage function by changing positive or negative voltages or magnitude of voltages applied at two ends of the medium, so that an electric field induces the material to undergo structural transformation or phase change. The medium material includes but is not limited to a ferroelectric material, a compound phase change storage material, and the like.

The second implementation: there are three medium layers in the memory cell hole.

Refer to FIG. 1 to FIG. 16 and FIG. 20. What this implementation differs from the first implementation lies in that this implementation is provided with three medium layers, which need to be disposed in step 6 in the process, as shown in FIG. 13 to FIG. 18.

In this implementation, the intermediate medium layer includes an insulating medium layer 151 and a second medium layer 150 as a buffer layer. Materials of various mediums involved can be combined in the following table. Each combination is an embodiment. FIG. 20 is a schematic structural diagram of this implementation.

| | Base structure Conductive medium | Intermediate medium layer | | Core medium layer |
|---|---|---|---|---|
| | | First medium layer | Second medium layer | |
| Embodiment 6 | P+-type semiconductor | Insulating medium | Lightly-doped N-type semiconductor | N+-type semiconductor or conductor |
| Embodiment 7 | N+-type semiconductor or conductor | Insulating medium | Lightly-doped P-type semiconductor | P+-type semiconductor |
| Embodiment 8 | P-type Schottky metal | Insulating medium | Lightly-doped N-type semiconductor | N+-type semiconductor or conductor |
| Embodiment 9 | N-type Schottky metal | Insulating medium | Lightly-doped P-type semiconductor | P+-type semiconductor or conductor |

A thickness of the insulating medium in the above table is preferably 0.5 nm to 5 nm.

In the present disclosure, interdigitated structures including interdigitated strips and common connecting strips are formed, the two interdigitated structures intersect with each other, a plurality of independent memory units isolated by insulators are present between interdigitated strips, and the insulators are the insulating medium filled in the division groove. In each layer of the base structure, each memory unit cell includes two memory bits, each memory bit includes a first medium—a second medium—a core medium, and material of the first medium and that of the core medium meet the requirement of the PN junction or the Schottky structure.

Writing operation of the memory cell: a programming voltage is applied between a selected core medium layer and a selected conductive medium in the base structure, and the programming voltage breaks down the first medium layer to complete "writing".

Reading operation of the memory cell: a connection/disconnection state between the selected core medium layer and the selected conductive medium in the base structure is detected, to identify whether the first medium layer is broken down, that is, data stored in the memory cell.

What is claimed is:

1. A method for manufacturing a fully self-aligned high-density three-dimensional (3D) multi-layer memory, comprising:
    step 1: forming a base structure, wherein a predetermined number of conductive medium layers and a predetermined number of insulating medium layers are disposed in such a manner that the conductive medium layers and the insulating medium layers are alternately stacked on each other, to form the base structure; and
    step 2: grooving the base structure, wherein the base structure is grooved to form a curved division groove penetrating from a top layer to a bottom layer in the base structure, so that the division groove divides the base structure into two interdigitated structures that are staggered and separated from each other;
    step 3: filling an insulating medium in the division groove;
    step 4: deep-hole etching the insulating medium in step 3 to form memory cell holes discretely arranged along the division groove, wherein the insulating medium is present between adjacent memory cell holes, and the conductive medium layers and the insulating medium layers of the base structure are exposed at the inner walls of the memory cell holes; and
    step 5: disposing various layers of medium required by a preset memory structure layer by layer onto inner walls of the memory cell holes, comprising:
    step 5.1: depositing an intermediate medium layer on the inner wall of each memory cell hole step 5.2: etching the intermediate medium layer in a bottom area of the memory cell hole, to form a through hole penetrating through the intermediate medium layer; and
    step 5.3: disposing a core medium layer in the memory cell hole; wherein
    materials of the conductive medium layer, the intermediate medium layer, and the core medium layer are one of the following:
    (a) the conductive medium layer is a P-type semiconductor, the intermediate medium layer is an insulating material, and the core medium layer is an N-type semiconductor;
    (b) the conductive medium layer is the N-type semiconductor, the intermediate medium layer is the insulating material, and the core medium layer is the P-type semiconductor;
    (c) the conductive medium layer is Schottky metal, the intermediate medium layer is the insulating material, and the core medium layer is a semiconductor; and
    (d) the conductive medium layer is the semiconductor, the intermediate medium layer is the insulating material, and the core medium layer is the Schottky metal.

2. The method for manufacturing the fully self-aligned high-density 3D multi-layer memory according to claim 1, wherein in step 5, the preset memory structure is:
    a PN junction semiconductor memory structure, in a case that the materials of the conductive medium layer, the intermediate medium layer, and the core medium layer are one of the following:
    (a) the conductive medium layer is a P-type semiconductor, the intermediate medium layer is an insulating material, and the core medium layer is an N-type semiconductor; and (b) the conductive medium layer is the N-type semiconductor, the intermediate medium layer is the insulating material, and the core medium layer is the P-type semiconductor; or
    a Schottky diode memory structure, in a case that the materials of the conductive medium layer, the intermediate medium layer, and the core medium layer are one of the following:
    (c) the conductive medium layer is Schottky metal, the intermediate medium layer is the insulating material, and the core medium layer is a semiconductor; and (d) the conductive medium layer is the semiconductor, the intermediate medium layer is the insulating material, and the core medium layer is the Schottky metal.

3. The method for manufacturing the fully self-aligned high-density 3D multi-layer memory according to claim 1, wherein in step 4, the memory cell holes are through holes penetrating through the base structure.

4. A method for manufacturing a fully self-aligned high-density three-dimensional (3D) multi-layer memory, comprising:
    step 1: forming a base structure, wherein a predetermined number of conductive medium layers and a predetermined number of insulating medium layers are disposed in such a manner that the conductive medium layers and the insulating medium layers are alternately stacked on each other, to form the base structure; and
    step 2: grooving the base structure, wherein the base structure is grooved to form a curved division groove penetrating from a top layer to a bottom layer in the base structure, so that the division groove divides the base structure into two interdigitated structures that are staggered and separated from each other;
    step 3: filling an insulating medium in the division groove;
    step 4: deep-hole etching the insulating medium in step 3 to form memory cell holes discretely arranged along the division groove, wherein the insulating medium is present between adjacent memory cell holes, and the conductive medium layers and the insulating medium layers of the base structure are exposed at the inner walls of the memory cell holes; and
    step 5: disposing various layers of medium required by a preset memory structure layer by layer onto inner walls of the memory cell holes, comprising:
    step 5.1: depositing an intermediate medium layer on an inner wall of each memory cell hole;
    step 5.2: etching the intermediate medium layer in a bottom area of the memory cell hole, to form a through hole penetrating through the intermediate medium layer; and
    step 5.3: disposing a core medium layer in each memory cell hole; wherein the conductive medium layer is a conductor, the intermediate medium layer is a memory medium, and the core medium layer is the conductor.

5. The method for manufacturing the fully self-aligned high-density 3D multi-layer memory according to claim 4, wherein in step 5, the preset memory structure is one of the following structures: a resistance change memory structure, a magnetic change memory structure, a phase change memory structure, and a ferroelectric memory structure.

6. The method for manufacturing the fully self-aligned high-density 3D multi-layer memory according to claim 4, wherein in step 4, the memory cell holes are through holes penetrating through the base structure.

7. A method for manufacturing a fully self-aligned high-density three-dimensional (3D) multi-layer memory, comprising:
    step 1: forming a base structure, wherein a predetermined number of conductive medium layers and a predetermined number of insulating medium layers are disposed in such a manner that the conductive medium layers and the insulating medium layers are alternately stacked on each other, to form the base structure; and
    step 2: grooving the base structure, wherein the base structure is grooved to form a curved division groove penetrating from a top layer to a bottom layer in the base structure, so that the division groove divides the base structure into two interdigitated structures that are staggered and separated from each other;
    step 3: filling an insulating medium in the division groove;
    step 4: deep-hole etching the insulating medium in step 3 to form memory cell holes discretely arranged along the division groove, wherein the insulating medium is present between adjacent memory cell holes, and the conductive medium layers and the insulating medium layers of the base structure are exposed at the inner walls of the memory cell holes; and
    step 5: disposing various layers of medium required by a preset memory structure layer by layer onto inner walls of the memory cell holes, comprising:
    step 5.1: depositing an insulating layer on an inner wall of each memory cell hole, and then depositing a buffer layer on an inner wall of the insulating layer;
    step 5.2: etching the insulating layer and the buffer layer in a bottom area of the memory cell hole, to form a through hole penetrating through the insulating layer and the buffer layer; and
    step 5.3: disposing a core medium layer in the memory cell hole; wherein
    materials of the conductive medium layer, the buffer layer, and the core medium layer are one of the following:
    (1) the conductive medium layer is a P+-type semiconductor, the buffer layer is a lightly-doped N-type semiconductor, and the core medium layer is an N+-type semiconductor or a conductor;
    (2) the conductive medium layer is the N+-type semiconductor or the conductor, the buffer layer is a lightly-doped P-type semiconductor, and the core medium layer is the P+-type semiconductor;
    (3) the conductive medium layer is P-type Schottky metal, the buffer layer is the lightly-doped N-type semiconductor, and the core medium layer is the N+-type semiconductor or the conductor; and
    (4) the conductive medium layer is N-type Schottky metal, the buffer layer is the lightly-doped P-type semiconductor, and the core medium layer is the P+-type semiconductor or the conductor.

8. The method for manufacturing the fully self-aligned high-density 3D multi-layer memory according to claim 7, wherein in step 5, the preset memory structure is:
    a PN junction semiconductor memory structure, in a case that the materials of the conductive medium layer, the buffer layer, and the core medium layer are one of the following: (1) the conductive medium layer is a P+-type semiconductor, the buffer layer is a lightly-doped N-type semiconductor, and the core medium layer is an N+-type semiconductor or a conductor; and (2) the conductive medium layer is the N+-type semiconductor or the conductor, the buffer layer is a lightly-doped P-type semiconductor, and the core medium layer is the P+-type semiconductor; or
    a Schottky diode memory structure, in a case that the materials of the conductive medium layer, the buffer layer, and the core medium layer are one of the following: (3) the conductive medium layer is P-type Schottky metal, the buffer layer is the lightly-doped N-type semiconductor, and the core medium layer is the N+-type semiconductor or the conductor; and (4) the conductive medium layer is N-type Schottky metal, the buffer layer is the lightly-doped P-type semiconductor, and the core medium layer is the P+-type semiconductor or the conductor.

9. The method for manufacturing the fully self-aligned high-density 3D multi-layer memory according to claim 7, wherein in step 4, the memory cell holes are through holes penetrating through the base structure.

* * * * *